United States Patent [19]
Kim et al.

[11] Patent Number: 5,194,396
[45] Date of Patent: Mar. 16, 1993

[54] METHOD OF FABRICATING BICMOS FIELD EFFECT TRANSISTORS

[75] Inventors: Young M. Kim, Kwangju-shi; Seong J. Kang; Jong S. Lyu, both of Daejeon-shi, all of Rep. of Korea

[73] Assignee: Korea Electronics and Telecommunications Research, Rep. of Korea

[21] Appl. No.: 763,171

[22] Filed: Sep. 20, 1991

[30] Foreign Application Priority Data

Sep. 20, 1990 [KR] Rep. of Korea ............ 90-14891

[51] Int. Cl.⁵ ............... H01L 21/70; H01L 27/00
[52] U.S. Cl. ............................. 437/31; 437/59; 148/DIG. 9; 257/526
[58] Field of Search ............... 437/59, 51, 31; 148/DIG. 9; 357/43

[56] References Cited

U.S. PATENT DOCUMENTS

4,868,135 9/1989 Ogura et al. ............... 357/43

Primary Examiner—Olik Chaudhuri
Assistant Examiner—Long Pham
Attorney, Agent, or Firm—Evenson, Wands, Edwards, Lenahan & McKeown

[57] ABSTRACT

There is disclosed a method of fabricating BiCMOS semiconductor devices. External metal lines are not used for connecting the NPN bipolar device and NMOS device, or NPN bipolar device and PMOS device. In this case, the collector and base of the bipolar device are respectively in common with the drain and source of the CMOS. The bipolar transistor is in common with the bulk region of the CMOS, so that the diffusion layer is commonly used in the NPN-PMOS pair, and the diffusion layers of the connecting part are connected together in the NPN-PMOS pair. A metal line is connected to the junction of the diffusion layers, thus decreasing the connecting area of the metal line. Hence, the integrability of the chip is increased, and the metal connection causes a reduction of the RC delay time, thus improving the operational speed.

6 Claims, 11 Drawing Sheets

METHOD OF FABRICATING BICMOS FIELD EFFECT TRANSISTORS

BACKGROUND OF THE INVENTION

The present invention concerns the cell structure of BiCMOS, and more particularly a method of fabricating BiCMOS field effect transistors (FETs) used in a very large scale integrated circuits (VLSI).

In a conventional BiCMOS type field effect transistor, a Bipolar device is isolated from a metal oxide semiconductor device in a silicon substrate, and therefore a metal line must be used to electrically connect the two devices.

Moreover, the current drive capability that is the advantage of the BiCMOS device is usually obtained by connecting the drain of the NMOS to the collector of the NPN bipolar device, and the source of the NMOS to the base of the NPN bipolar device. Likewise, the drain of the PMOS is connected to the base of the NPN bipolar device, and the source of the PMOS to the collector of the NPN bipolar device.

Such NPN-NMOS and NPN-PMOS pairs each function as a complementary device, and if being connected like CMOS, it complementarily operates used as a logic circuit without static power consumption.

If the bipolar device and the MOS device are separately fabricated in a conventional manner in order to construct such a circuit, undesirable external connections are needed so that the area for connecting metal lines is much consumed throughout a chip. There is disclosed a method of fabricating a BiCMOS device of such a construction in U.S. Pat. No. 4,868,135 issued on Sep. 19, 1989.

In this U.S. patent, there is used only a diffusion layer for connecting a P-type FET and an NPN transistor, or N-type FET and a PNP transistor. Namely, the P-type FET is connected to the NPN transistor by using only a P+ diffusion layer, and the N-type FET to the PNP by using only a N+ diffusion layer, and therefore the electrical characteristics of the devices are degraded.

SUMMARY OF THE INVENTION

The object of the present invention is to provide a BiCMOS FET wherein the metal line connecting area is reduced so as to increase the integrability and to improve the operational effect, and a method of fabricating it.

According one aspect of the present invention, as the bipolar device is used only an NPN transistor of N+-type subcollector type, thereby improving the electrical characteristics of the device. For example, the present invention employs the NPN transistor whose electrical characteristics are better than those of the PNP transistor.

According to another aspect of the present invention, external metal lines are not used for connecting the NPN bipolar device and NMOS device, or NPN bipolar device and PMOS device. In this case, the collector and base of the bipolar device are respectively in common with the drain and source of the CMOS. The bipolar transistor is in common with the bulk region of the CMOS, so that the diffusion layer is commonly used in the NPN-PMOS pair, and the diffusion layers of the connecting part are connected together in the NPN-PMOS pair. A metal line is connected to the junction of the diffusion layers, thus decreasing the connecting area of the metal line. Hence, the integrability of the chip is increased, and the metal connection causes a reduction of the RC delay time, thus improving the operational speed.

According to still another aspect of the present invention, there is provided a method of fabricating BiCMOS FETs comprising the steps of:

(a) applying a photosensitive material to a P-type silicon substrate with an oxide layer formed thereon to form a mask pattern for forming an embedded layer of As ions;

(b) forming a P-type isolation layer of boron by isolation mask process;

(c) implanting through a P-type well mask boron ions into the substrate at a dose of $5 \times 10^{12}/Cm^2$ with an energy of 60 KeV, and heating the substrate at a high temperature, so as to form P-type well layer;

(d) depositing a silicon nitride thin film on the substrate in order to prevent the escaping of boron ions;

(e) performing a field region mask process and field ions implantation mask process so as to implant boron ions into the substrate at a dose of $1 \times 10^{13}/Cm^2$ with an energy of 60 KeV;

(f) forming a silicon oxide layer by oxidizing the silicon present on the substrate;

(g) performing a P-type mask process so as to implant boron ions into the substrate at a dose of $5 \times 10^{13}/Cm^2$ with an energy of 80 KeV, and heating the substrate, thus forming P-type base layer;

(h) performing an NMOS threshold voltage adjusting mask process so as to implant boron ions into activation region at a dose of $5 \sim 7 \times 10^{11}/Cm^2$ with an energy of 45 KeV;

(i) performing a PMOS threshold voltage adjusting mask process so as to implant boron ions into PMOS region at a dose of $3 \sim 5 \times 10^{11}/Cm^2$ with an energy of 45 KeV;

(j) growing a gate oxide layer with a thickness of 400Å by thermal oxidation in an ambient of trichloroethylene and oxide;

(k) depositing a polycrystalline silicon layer with a thickness of 3800Å bylow pressure chemical vapor deposition, and performing a gate mask process so as to define a MOS gate region and polycrystalline silicon stored region;

(l) performing a P-type source/drain mask process so as to implant boron ions into the substrate at a dose of $5 \times 10^{15}/Cm^2$ with an energy of 45 KeV;

(m) heating the substrate at 950° C. in an ambient of nitrogen for 30 minutes so as to activate the boron and arsenic ions to form source/drain regions;

(n) depositing an oxide layer of 7000Å and performing contact mask process so as to expose a metal contact region; and (o) depositing an aluminum layer with a thickness of 1μm and performing a metal mask process so as to form a metal wiring, the regions to be bonded being exposed in reference to the metal wiring.

The BiCMOS FET of the present invention is characterized in that the source of NMOS and the base of NPN bipolar transistor have a common junction of metal wiring.

The BiCMOS FET of the present invention is characterized in that the drain of NMOS and the collector of NPN bipolar transistor have a common junction of N-type diffusion layer.

The BiCMOS FET of the present invention is characterized in that the drain of PMOS and the collector of NPN bipolar transistor have a common junction of metal wiring.

The BiCMOS FET of the present invention is characterized in that the source of PMOS and the collector of NPN bipolar transistor have a common junction of P-type diffusion layer.

The BiCMOS FET of the present invention is characterized in that the NMOS-NPN pair and the PMOS-NPN pair are isolated from each other by a P-type isolation layer, complementarily functioning over N-type embedded layers.

The present invention will now be described with reference to the drawings attached only by way of example.

DETAILED DESCRIPTION OF A CERTAIN PREFERRED EMBODIMENT

Figure 1A:
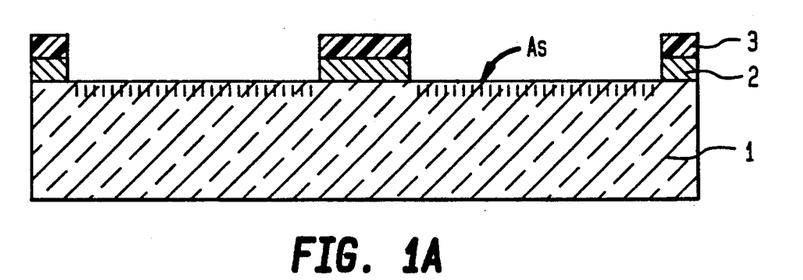
FIGS. 1A–1Z show cross sectional views for illustrating the steps of fabricating BiCMOS FETs according to the present invention.
Figure 1B:
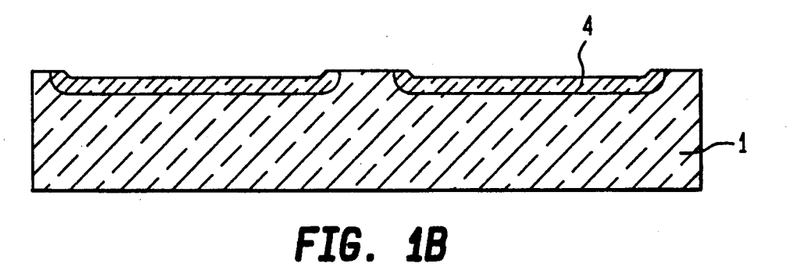

Referring to FIG. 1, an oxide layer 2 is deposited on the upper surface of a P-type silicon substrate 1 with the thickness of 15~25 ohm.cm. as shown in FIG. 1A. Then a photosensitive polymer film 3 is laid on the oxide layer 2 so as to form an embedded layer mask pattern. Thereafter, the oxide layer 2 is etched to implant arsenic (As) ions. An N-type embedded layer 4 is formed in the substrate, and residual photosensitive film 3 and oxide layers 2 are etched. Then the substrate is heated at a high temperature. The reason that the arsenic is used as the impurity is that the impurity is diffused into the collector of N-type epitaxial layer to be laid thereupon, and the diffusion coefficient is lower in the case of antimony (Sb) or arsenic (As) than in the case of phosphorous (P).

Figure 1C:
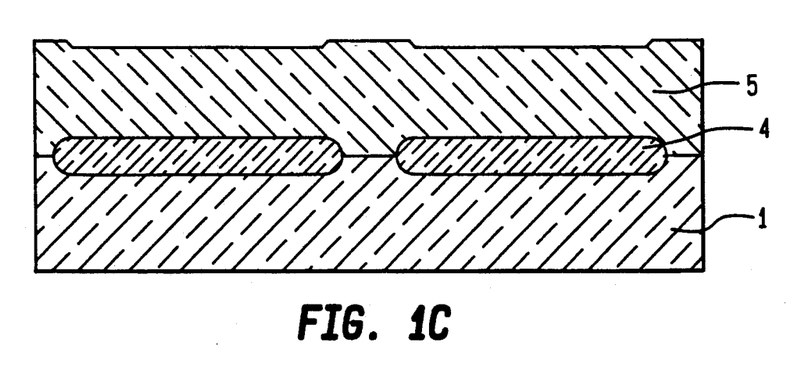
Figure 1D:
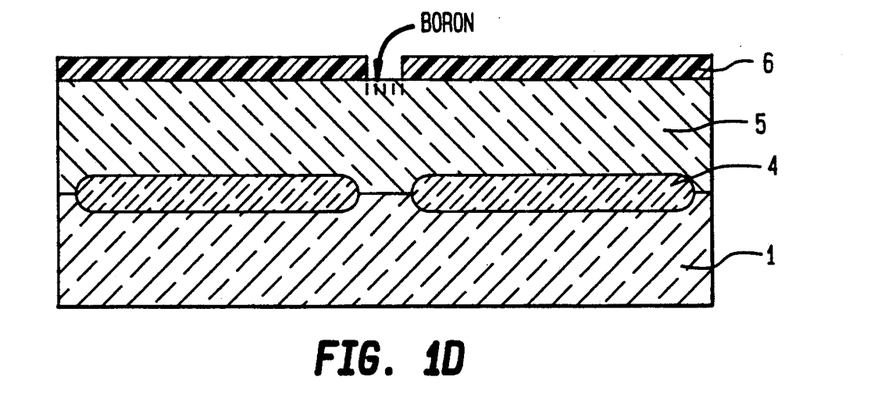

A P-type epitaxial layer 5 with the thickness of 1.5~2.0 μm is laid on the upper surface of the P-type silicon substrate 1 having the embedded N-type layer 4, as shown in FIG. 1C. The P-type epitaxial layer 5 is 10~15 ohm.cm. Then the N-type embedded layer 4 diffuses into the P-type epitaxial layer forming an elongated elliptic shape. A photosensitive film 6 is applied to the upper surface of the P-type epitaxial layer 5, which is subjected to the isolation mask process. The boron ions are implanted into the substrate at a dose of $1 \times 10^{14}/Cm^2$ with an energy of 120 KeV, as shown in FIG. 1D.

Figure 1E:
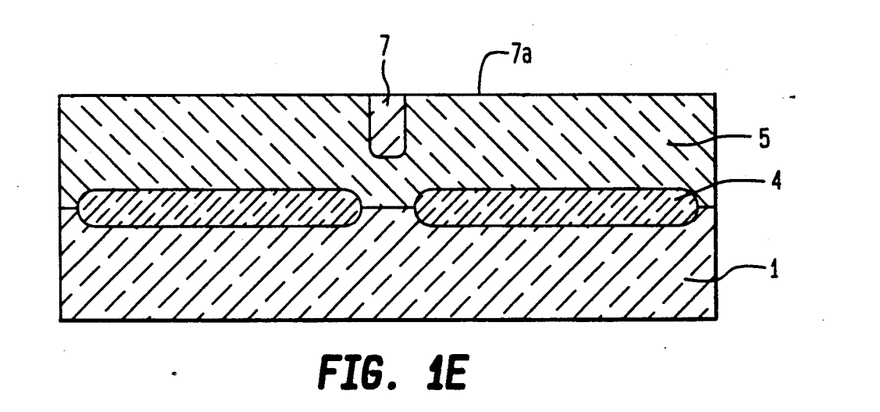

The substrate is heated to diffuse the P-type isolation layer 7 of boron near the N-type embedded layer 4, and the photosensitive film 6 is removed. Then the silicon (8i) on the substrate and the oxygen in the air are combined to form a silicon oxide ($SiO_2$) layer 7A preventing the escapement of boron ions, as shown in FIG. 1E.

Figure 1F:
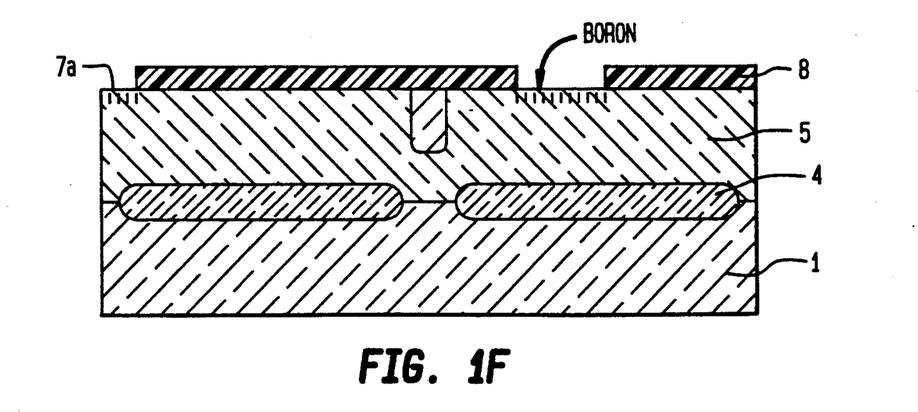

A photosensitive film 8 is applied onto the silicon oxide layer 7A that is above the P-type isolation layer 7, subjected to the P-type well mask process so as to implant boron ions into the well at a dose of $5 \times 10^{12}/Cm^2$ with an energy of 60 KeV, as shown in FIG. 1F.

Figure 1G:
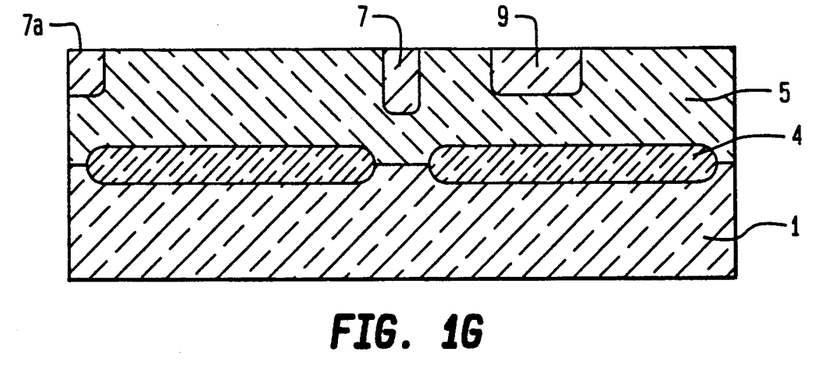

After removing the photosensitive film 8, the substrate is heated at high temperature so as to make the depth of the P-type well layer 9 be in about 1.0 μm from the silicon substrate 1, as shown in FIG. 1g.

Figure 1H:
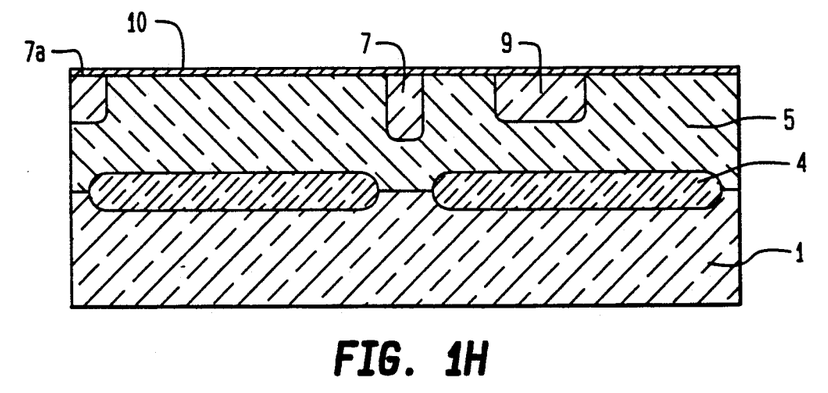

Then a thin film 10 of silicon nitride ($Si_3N_4$) is deposited on the silicon oxide 7a in order to prevent the escapement of boron ions, as shown in FIG. 1h.

Figure 1I:
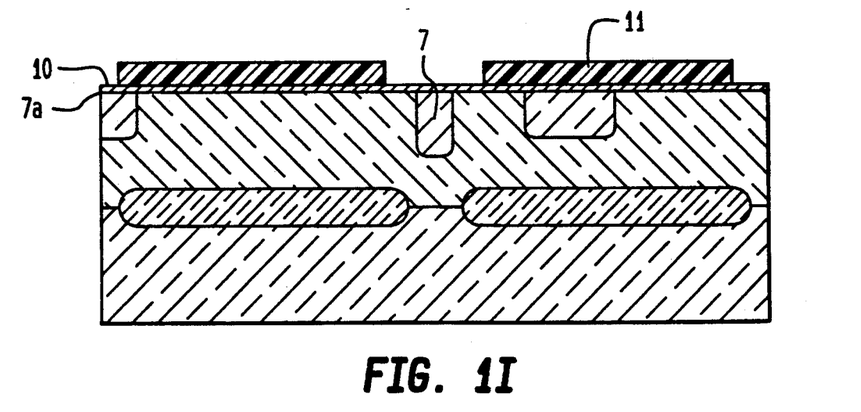
Figure 1J:
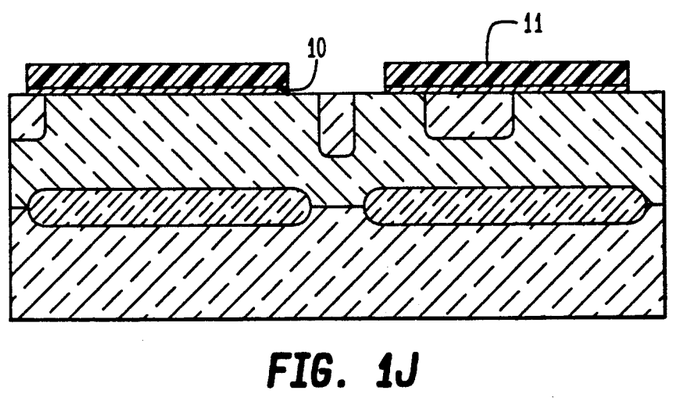
Figure 1K:
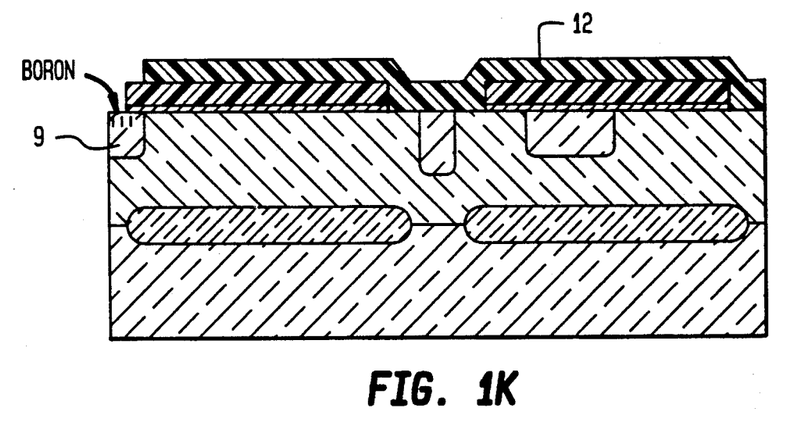

A photosensitive film 11 is applied onto the silicon nitride 10, subjected to a mask process in reference to the P-type well layer 9 so as to expose the field region, as shown in FIG. 1I. While retaining a photosensitive film 11, a part of the silicon nitride layer 10 is removed, as shown in FIG. 1J. Again, a photosensitive film 12 is applied onto the substrate, which is subjected to the field ion implantation mask process so as to implant boron ions into the substrate at a dose of $1 \times 10^{13}/Cm^2$ with an energy of 60 KeV, as shown in FIG. 1K.

Figure 1L:
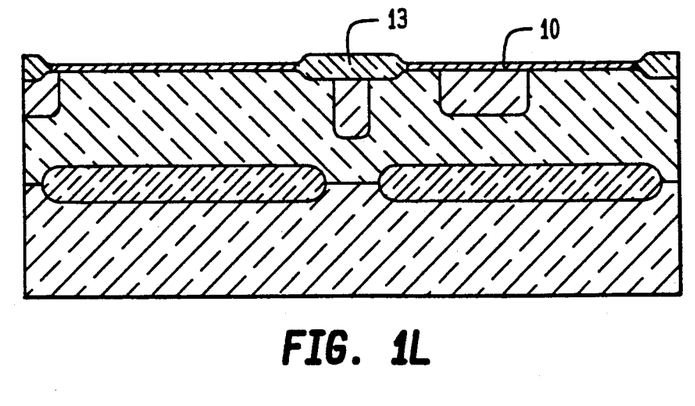
Figure 1M:
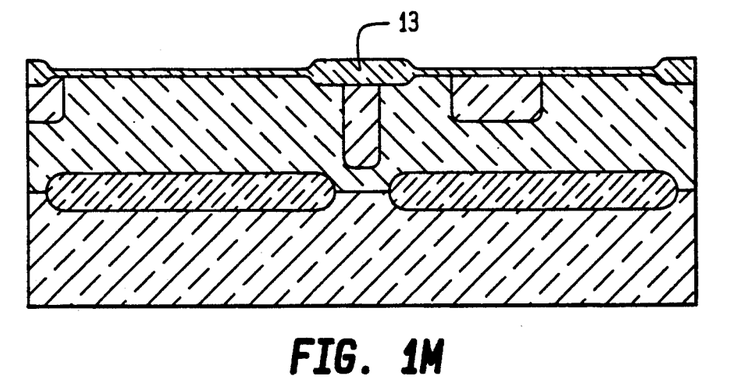

Next the two photosensitive films 11 and 12 are removed, and the partly removed silicon nitride 10 is used so as to oxidize the exposed silicon surface forming a silicon oxide layer 13 with the thickness of 8000Å as shown in FIG. 1L. Then the silicon nitride layer 10 is completely removed, as shown in FIG. 1M. This process generally employs local oxidation of silicon (LOCOS), but may also employ side wall masked isolation (SWAMI) or trench isolation.

Figure 1N:
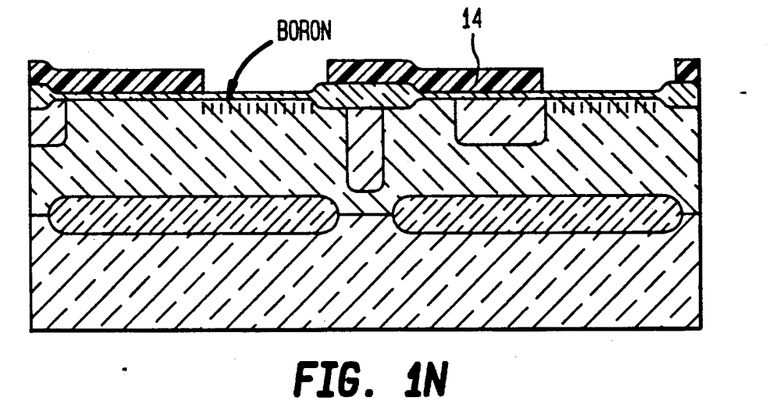
Figure 1O:
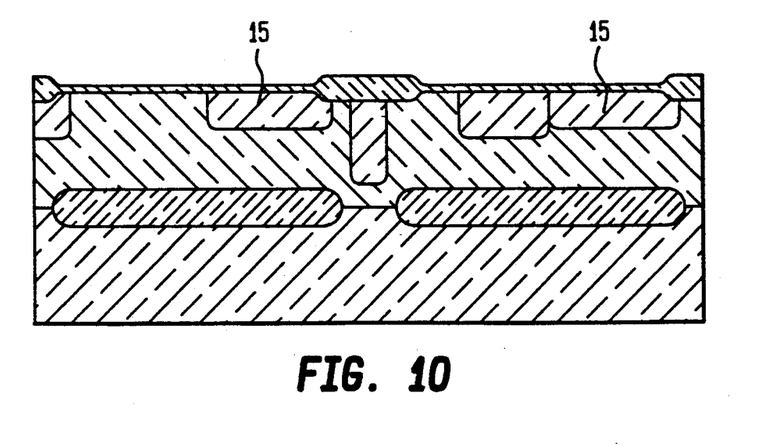

A photosensitive film 14 is applied onto the substrate subjected to the P-type base mask process, so that the boron ions may be implanted into the exposed P-type base region at a dose of $5 \times 10^{13}/Cm^2$ with an energy of 80 KeV, as shown in FIG. 1N. The substrate is heated to make the depth of the P-type base layer 15 be in 0.5 μm. Then the photosensitive film 14 is removed, as shown in FIG. 1O.

Figure 1P:
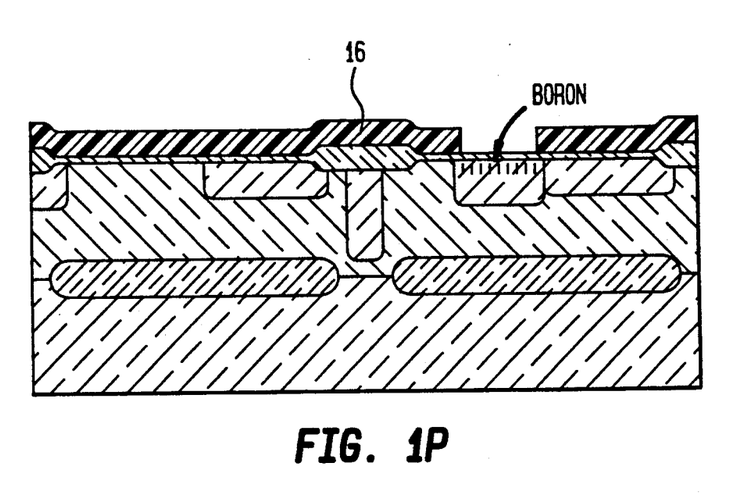

A photosensitive film 16 is applied onto the substrate subjected to the NMOS threshold voltage adjusting mask process in reference to the activation region, into which the boron ions are implanted at a dose of $5 \sim 7 \times 11/cm^2$ according to the threshold voltage with an energy of 45 KeV, as shown in FIG. 1P.

Figure 1Q:
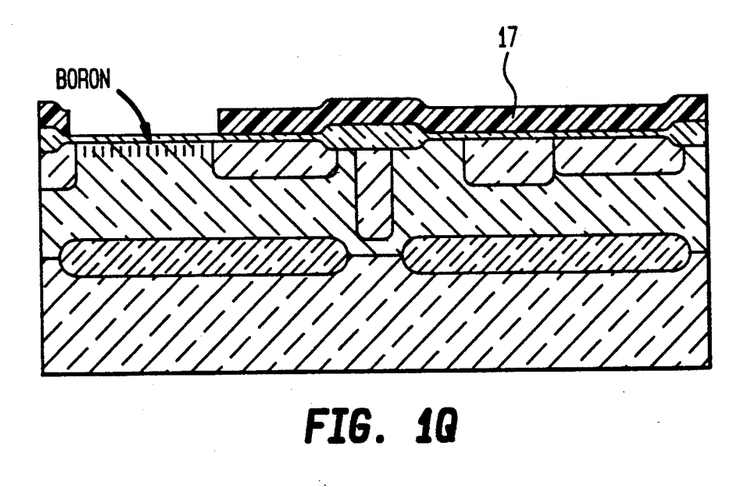

After removing the photosensitive film 16, another photosensitive film (17) is applied onto the substrate subjected to the PMOS threshold voltage adjusting mask in reference to the activation, and the boron ions are implanted into the PMOS at a dose of $3 \sim 5 \times 10^{11}/Cm^2$ according to the threshold voltage, as shown in FIG. 1Q.

Figure 1R:
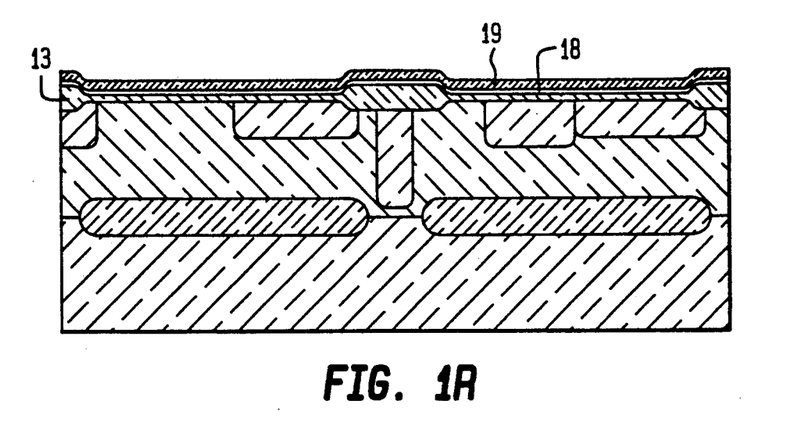
Figure 1S:
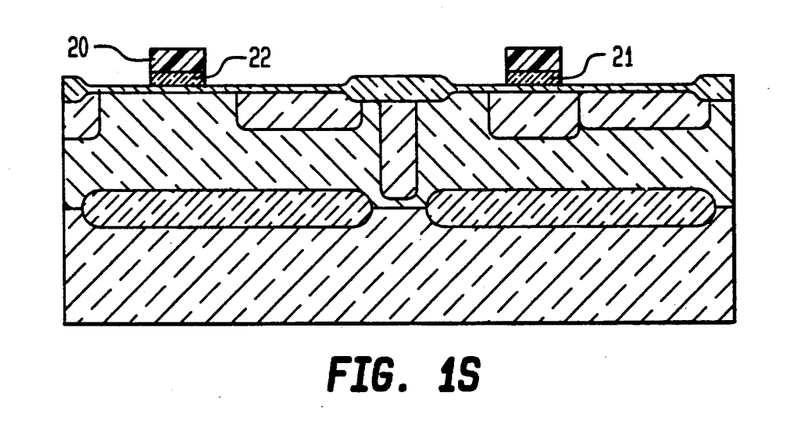

Next a gate oxide layer 18 of 400Å is grown by thermal oxidation at 1000° C. in an ambient of trichloroethylene (TCE) and oxygen, as shown in FIG. 1R. Then deposited on the substrate is a polycrystalline silicon layer 19 with a thickness of 3800Å by low pressure chemical vapor deposition, and doped with an N-type impurity in an ambient of $POCL_3$. A photosensitive film 20 is applied onto the substrate in reference to the activation region subjected to a gate mask process so as to define a MOS gate region 21 and polycrystalline silicon resistor region 22, as shown in FIG. 1S.

Figure 1T:
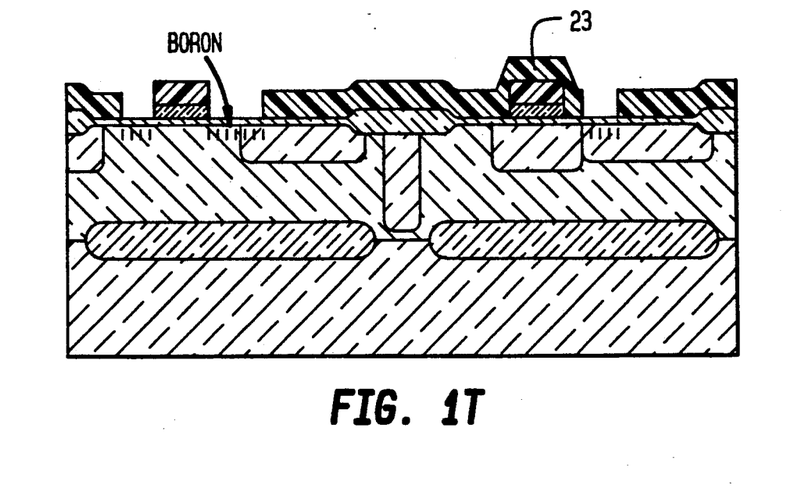

While retaining the photosensitive film 20, another photosensitive 23 is applied onto the substrate subjected to a P-type source/drain mask process so as to implant boron ions into the parts of the substrate from which the photosensitive film is removed at a dose of $5 \times 10^{15}/Cm^2$ with an energy of 45 KeV, as shown in FIG. 1T.

Figure 1U:
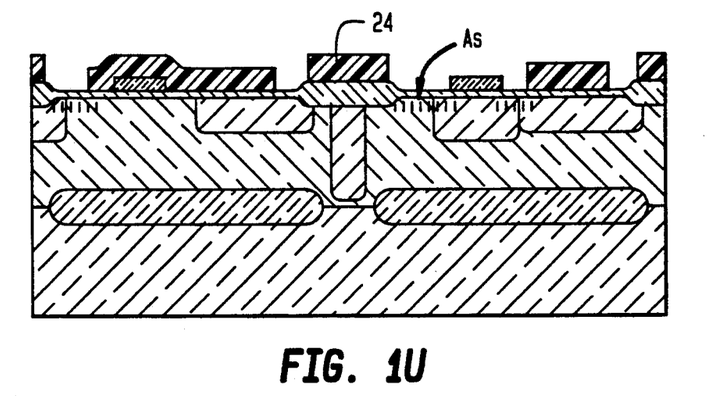

Next after completely removing the photosensitive films 20 and 23, another photosensitive film 24 is applied onto the substrate subjected to an N-type source/drain mask process so as to implant arsenic into the substrate at a dose of $4 \times 10^{15}/\text{Cm}^2$ with an energy of 45 KeV, as shown in FIG. 1U.

Figure 1V:
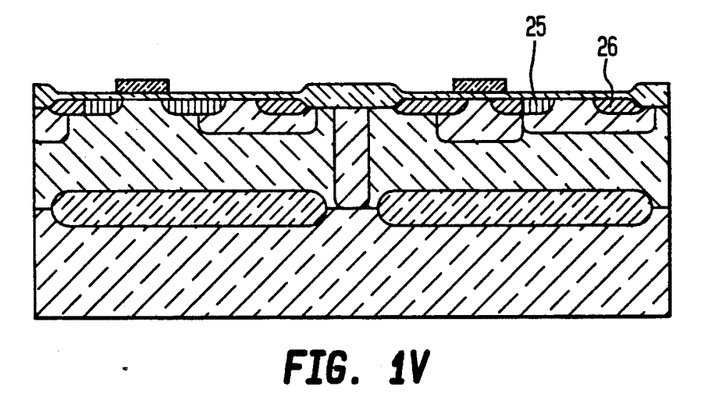
Figure 1W:
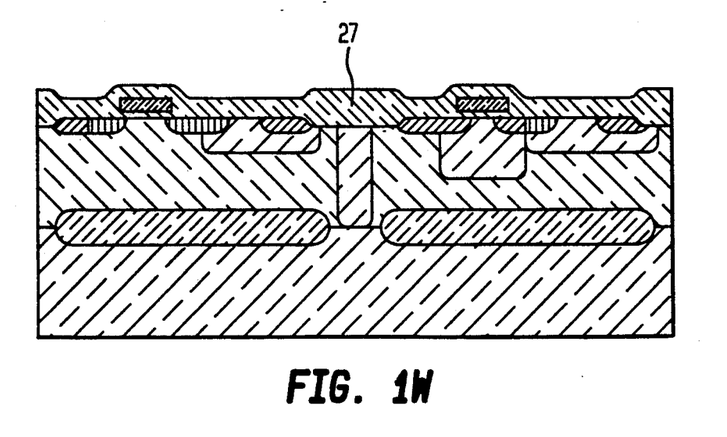
Figure 1X:
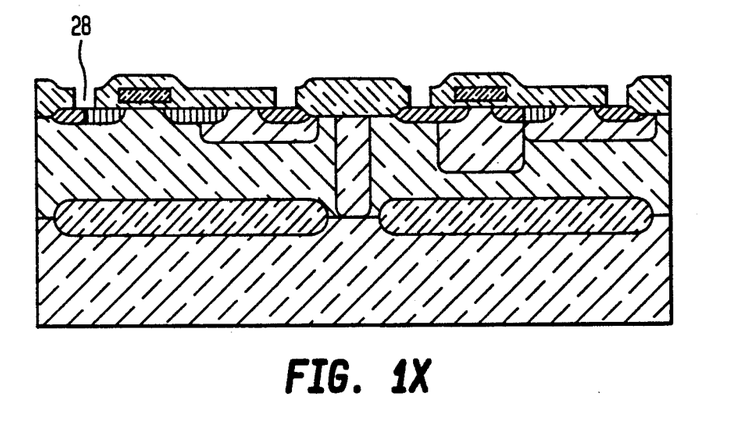

After removing the photosensitive film 24, the substrate is heated at 950° C. in an ambient of nitrogen for 30 minutes so as to activate the boron and arsenic ions to form source/drain regions 25 and 26, as shown in FIG. 1V. Then an oxide layer 27 of 7000Å is deposited on the substrate, as shown in FIG. 1W, subjected to a contact mask process so as to expose a metal contact region or aperture 28, as shown in FIG. 1X.

Figure 1Y:
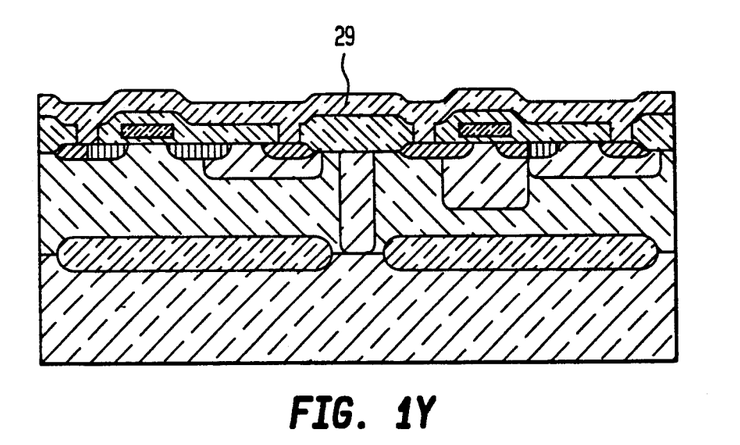
Figure 1Z:
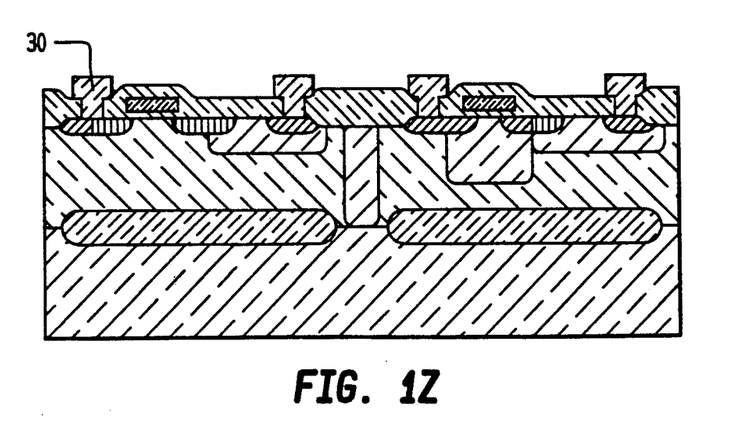

Then deposited on the substrate is an aluminum layer 29 with a thickness of 4 μm, as shown in FIG. 1Y, subjected to a metal mask process so as to form a metal wiring 30, and heated. An oxide layer of 1 μm is deposited on the substrate by plasma enhanced vapor deposition, subjected to a pad mask process in reference to the metal wiring 30 so as to expose the portions to be bonded, as shown in FIG. 1Z.

Figure 2:
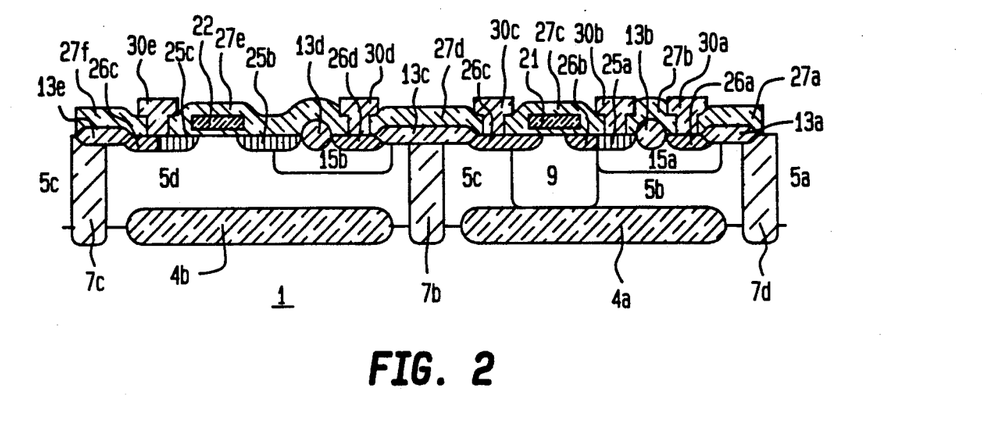
FIG. 2 is a cross sectional view of a BiCMOS type FET fabricated according to the present invention.

Referring to FIG. 2 for illustrating a BiCMOS FET of the present invention, the N-type diffusion layer 25a and N-type diffusion layer 26a form a NPN transistor, while the N-type diffusion layer 26c, P-type diffusion layer 9 and N-type diffusion layer 26b form an N-channel MOS semiconductor device (NMOS).

The metal wiring 30b connects two semiconductor devices, i.e. NPN transistor and NMOS transistor. The reason is that the P-type diffusion layer 25a forms a PN junction to create a built-in-potential to be overcome by an external metal connection.

On the left side of the P-type isolation layer 7b form the N-type diffusion layer 26d, P-type diffusion layer 25b and N-type diffusion layer 26e an NPN transistor, while the P-type diffusion layer 25b, N-type epitaxial layer 15b and P-type diffusion layer 25c form a P-channel MOS transistor (PMOS). In this case, the NPN transistor (bipolar device) and P-channel MOS transistor (PMOS device) are internally connected with each other by means of the common P-type diffusion layer 25b. Thus the pair of NPN-PMOS transistors does not require metallization to connect the two semiconductor devices, which more simplifies the processing steps compared to the NPN-NMOS transistor, thus reducing the size of the chip.

Figure 3:
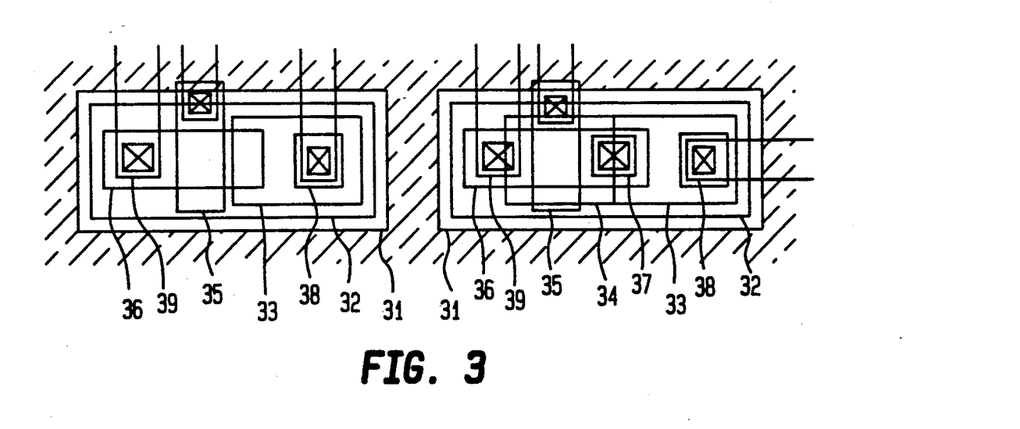
FIG. 3 is a plane view of a BiCMOS FET fabricated according to the present invention.

Referring to FIG. 3, the reference numeral 31 indicates device isolation P-type diffusion layer, 32 N-type embedded layer, 33 P-type base, 34 P-type well, 35 polycrystalline silicon gate, 36 activation region, 37 metal contact, 38 emitter, and 39 collector.

Figure 4A:
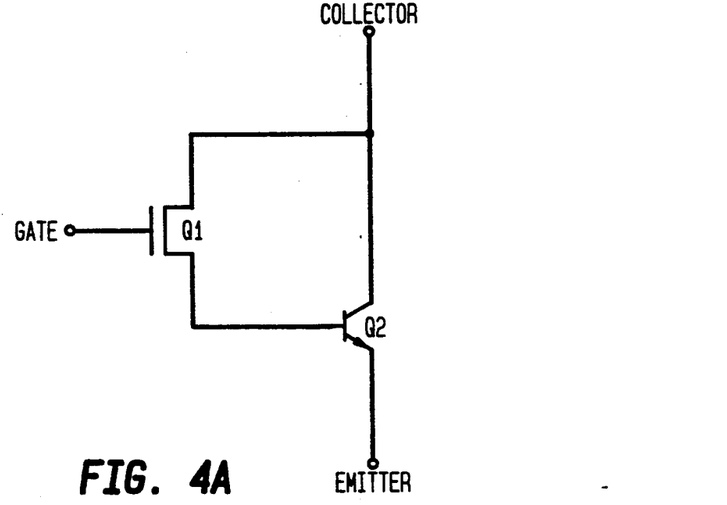
FIGS. 4A and 4B are equivalent circuits of a BiCMOS FET fabricated according to the present invention.
Figure 4B:
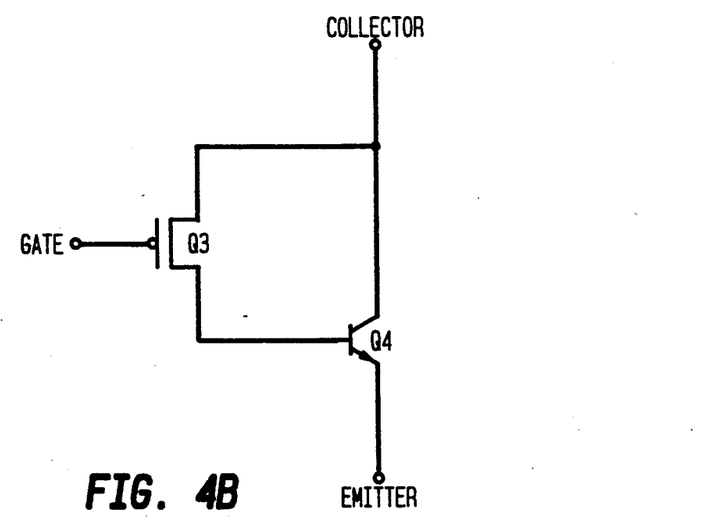

FIGS. 4A and 4B represent respectively P-channel BiCMOS and N-channel BiCMOS, wherein Q1 represents PMOS transistor, Q2 and Q4 NPN transistors, and Q3 NMOS transistor.

What is claimed is:

1. A method of fabricating BiCMOS field effect transistors (FETs) comprising the steps of:
   (a) selectively forming an oxide layer on a P-type silicon substrate and thereafter forming a layer of photosensitive material on said oxide layer, thereby obtained a mask pattern through which an embedded layer of arsenic ions is to be introduced into said P-type silicon substrate;
   (b) introducing arsenic ions into said P-type silicon substrate by way of the mask pattern obtained in step (a), so as to form an embedded layer of arsenic ions in the surface of said P-type silicon substrate;
   (c) forming an epitaxial semiconductor layer on the structure obtained in step (b);
   (d) forming a mask layer on said epitaxial semiconductor layer and introducing P-type impurities into said epitaxial layer by way of the mask layer formed thereon, so as to form a P-type isolation region in a surface portion of said epitaxial semiconductor layer;
   (e) forming a patterned photoresist layer on the surface of the epitaxial layer in which said P-type isolation region has been formed in step (d) and implanting boron ions into said P-type epitaxial layer at a dose of $5 \times 10^{12}/\text{cm}^2$ and an implant energy of 60 KeV and heating the resulting structure at a high temperature, so as to define a P-type well in said epitaxial layer;
   (f) removing the patterned photoresist layer and depositing a thin film of silicon nitride on the surface of said epitaxial layer, said thin film of silicon nitride serving to prevent escape of boron ions implanted in step (e);
   (g) forming a patterned photoresist layer on the surface of said thin film of silicon nitride, and removing an exposed portion of the thin film of silicon nitride deposited in step (f);
   (h) implanting boron ions into that portion of said P-type epitaxial layer exposed by the patterned photoresist layer and the removed exposed portion of the thin film of silicon nitride at a dose of $1 \times 10^{13}/\text{cm}^2$ and an implant energy of 60 KeV, so as to form a field region in said epitaxial layer;
   (i) removing the photoresist layer formed in step (g) and the thin film of silicon nitride and forming a silicon oxide region only on the field region;
   (j) forming a patterned photoresist layer on the surface of the structure resulting from step (i), and implanting boron ions by way of the patterned photoresist layer, so as to define P-type base regions in said epitaxial layer;
   (k) forming a patterned photoresist layer on the surface of the structure resulting from step (j) and implanting boron ions into one of said P-type base regions to form a base region of an NMOS device at a dose of $5-7 \times 10^{11}\text{-cm}^2$ and an implant energy of 45 KeV, so as to adjust a threshold voltage of said NMOS device;
   (l) removing the patterned photoresist layer formed in step (k) and forming a patterned photoresist layer on the surface of the resulting structure and implanting boron ions into another of said P-type base regions to form a base region of a PMOS device at a dose of $3-5 \times 10^{11}/\text{cm}^2$ and an implant energy of 45 KeV, so as to adjust a threshold voltage of said PMOS device;
   (m) removing the patterned photoresist layer formed in step (l) and growing, by thermal oxidation of said epitaxial layer in an ambient of trichloroethylene and oxygen, a gate oxide layer to a thickness of 400 Angstoms on said epitaxial layer;
   (n) depositing a polycrystalline silicon layer on the structure resulting from step (m) to a thickness of 3800 Angstoms by low pressure chemical vapor deposition;
   (o) forming an etch mask on the deposited polycrystalline silicon layer and etching back a portion of the gate oxide layer and the polycrystalline silicon layer exposed by the etch mask, so as to define an MOS gate region and a polycrystalline silicon resistor region;

(p) forming a patterned photoresist layer on the surface of the structure resulting from step (o) and implanting boron ions into the epitaxial layer exposed thereby at a dose of $5 \times 10^{15}/cm^2$ and an implant energy of 45 KeV, so as to form a P-type source/drain of an MOS device;

(q) removing the patterned photoresist layer of step (p) and forming a patterned photoresist layer on the surface of the structure resulting from step (q) and implanting arsenic ions into the epitaxial layer exposed thereby at a dose of $4 \times 10^{15}/cm^2$ and an implant energy of 45 KeV, so as to form an N-type source/drain of an MOS device;

(r) removing the patterned photoresist layer of step (q) and heating the resulting structure at 950° C. in an ambient of nitrogen for 30 minutes, so as to activate the boron and arsenic ions respectively implanted in steps (o) and (q);

(s) depositing an oxide layer to a thickness of 7000 Angstroms and selectively etching portions of the deposited oxide layer by using a contact mask, so as to form ohmic contact apertures in the deposited oxide layer; and (t) selectively depositing an aluminum layer to a thickness of one micron so as to form a metallic wiring layer which extends into the ohmic contact apertures formed in step (s).

2. A method according to claim 1, wherein said metallic wiring layer is formed so as to conductively join a source of an NMOS device with the base region of an NPN bipolar transistor.

3. A method according to claim 1, wherein a drain of an NMOS device and a collector of an NPN bipolar transistor are formed of a common N-type impurity region.

4. A method according to claim 1, wherein said metallic wiring layer is formed so as to conductively join a drain of a PMOS device with a collector region of an NPN bipolar transistor.

5. A method according to claim 1, wherein a source of a PMOS device and a collector of an PNP bipolar transistor are formed of a common P-type impurity region.

6. A method according to claim 1, wherein an NMOS-NPN transistor pair and a PMOS-PNP transistor pair overlie respective embedded layers formed in step (b) and are isolated from each other by said P-type isolation region formed in step (d).

* * * * *